United States Patent [19]
Schenz

[11] Patent Number: 5,765,692
[45] Date of Patent: Jun. 16, 1998

[54] CARRIER TAPE WITH ADHESIVE AND PROTECTIVE WALLS

[75] Inventor: James L. Schenz, Baytown Township, Washington County, Minn.

[73] Assignee: Minnesota Mining and Manufacturing Company, St. Paul, Minn.

[21] Appl. No.: 559,187

[22] Filed: Nov. 13, 1995

[51] Int. Cl.⁶ .................................................. B65D 73/02
[52] U.S. Cl. ........................ 206/713; 206/460; 206/722
[58] Field of Search ............................. 206/713, 714, 206/717, 460, 813, 345, 722

[56] References Cited

U.S. PATENT DOCUMENTS

| | | | |
|---|---|---|---|
| 1,320,692 | 11/1919 | Hulse | 206/813 X |
| 3,608,711 | 9/1971 | Wiesler et al. | 206/714 |
| 3,695,414 | 10/1972 | Wiesler et al. | 206/460 X |
| 4,298,120 | 11/1981 | Kaneko et al. | |
| 4,406,367 | 9/1983 | Bouwknegt | |
| 4,657,137 | 4/1987 | Johnson | |
| 4,702,788 | 10/1987 | Okui | |
| 4,736,841 | 4/1988 | Kaneko et al. | |
| 4,966,281 | 10/1990 | Kawanishi et al. | |
| 4,966,282 | 10/1990 | Kawanishi et al. | |
| 5,025,923 | 6/1991 | Okui | 206/714 |
| 5,089,314 | 2/1992 | Masujima et al. | |
| 5,132,160 | 7/1992 | Bird | |
| 5,150,787 | 9/1992 | Bird et al. | |
| 5,203,143 | 4/1993 | Gutentag | |
| 5,291,993 | 3/1994 | Schenz et al. | |
| 5,325,654 | 7/1994 | Juntunen et al. | |
| 5,491,013 | 2/1996 | Holley | 206/714 X |

FOREIGN PATENT DOCUMENTS

| | | | |
|---|---|---|---|
| 2 611 189 | 8/1988 | France | |
| 2908624 | 9/1980 | Germany | 206/330 |
| 3326132 | 2/1984 | Germany | 206/330 |
| 1-316198 | 12/1989 | Japan | |
| 4-128147 | 4/1992 | Japan | |
| 4-142263 | 5/1992 | Japan | |
| 05 112380 A | 7/1993 | Japan | |
| 406219487 | 8/1994 | Japan | 206/330 |
| 7907599 | 4/1981 | Netherlands | 206/330 |
| 2 083 000 | 3/1982 | United Kingdom | |

*Primary Examiner*—Bryon P. Gehman
*Attorney, Agent, or Firm*—Michaele A. Hakamaki

[57] ABSTRACT

A flexible carrier tape used for protecting components while they are being transported, wherein the carrier tape comprises a strip portion having a component-receiving surface and first and second longitudinal edge surfaces. A plurality of walls extend from the component-receiving surface between the first and second longitudinal edge surfaces, and the walls extend longitudinally along the carrier tape. The carrier tape further comprises an adhesive on at least a portion of the component-receiving surface between at least one of the plurality of walls and one of the first and second longitudinal edge surfaces.

24 Claims, 4 Drawing Sheets

CARRIER TAPE WITH ADHESIVE AND PROTECTIVE WALLS

BACKGROUND OF THE INVENTION

1. Technical Field

This invention relates generally to a carrier tape used for protecting components while they are being transported. More specifically, this invention relates to a carrier tape that includes an adhesive for securing the components and projecting walls for protecting the components.

2. Description of the Related Art

In the field of electronic circuit assembly, it is common to use robotic placement equipment to move electronic components such as resistors, capacitors, or memory chips from a supply source to a circuit board for attachment in a specific location on the circuit board. After attachment to the circuit board, the circuit 20 board may be further incorporated into an electronic device.

Robotic placement equipment is typically programmed to repeat a precise sequence of movements in every cycle. For electronic component assembly, the robotic equipment may be programmed to grasp a memory chip, for example, and place it in a specific location on a circuit board. This sequence of picking up a component and placing it on a circuit board will be performed for each circuit board that needs a component in a certain position on the circuit board. The robotic placement equipment therefore operates efficiently when a continuous supply of components is available for the robot to pick up during each cycle, and operates even more efficiently when those components are precisely positioned during each cycle so that the robotic placement equipment can easily grasp the components.

Because robotic placement equipment is often designed to recognize only components positioned in a precise position, if a component is not properly positioned when supplied to the robotic placement equipment, the robot may be unable to pick up the component and will therefore be unable to perform the next step in its sequence, such as placing that component on a circuit board. Alternatively, when the robot cannot recognize an improperly positioned component it may indicate that the component is defective, which can lead to the component being rejected. If this improper positioning of components occurs frequently, there can be significant and costly manufacturing delays in the assembly of the circuit boards.

Many times, the components supplied to robotic placement equipment are somewhat fragile and may be easily damaged (e.g., scratched or crushed) by even minimal physical contact. In fact, some components are so sensitive that any unnecessary contact with the component can make the component unusable. To prevent this damage, it is desirable for components to be protected from physical contact while being transported from the component manufacturer, during any time the components are in storage, and during the assembly process until the robotic placement equipment grasps the component.

A common way to supply components to robotic placement equipment is by a carrier tape. With a carrier tape, a component manufacturer typically loads components into a series of pockets that are precisely spaced along the length of the carrier tape, covers the components with a cover tape, and winds the loaded carrier tape into a roll or onto a reel. The loaded carrier tape may then transport the components from the component manufacturer to another manufacturer or assembler, where the roll of carrier tape may be mounted within some type of assembly process. The carrier tape is typically unwound from the roll and automatically advanced toward a robotic pick-up location. As the carrier tape advances, the robotic placement equipment removes the cover tape, after which it may remove the components from each succeeding pocket of the carrier tape to assemble the components into new products.

One type of carrier tape is known as a punched carrier tape, illustrated in U.S. Pat. Nos. 4,702,788 (Okui) and 5,203,143 (Gutentag). The pockets of punched carrier tapes are typically formed by die punching a series of holes through a strip of material, such as paper, having a thickness corresponding to the depth of the pockets to be formed. An adhesive strip is often adhered to one side of the strip of material so that some portion of the adhesive is exposed to the inside of the pocket, thereby creating an adhesive surface for securing a component in position inside the pocket. To use a punched carrier tape, one component is typically placed onto the adhesive surface in each pocket, over which a cover strip may be affixed. The carrier tape may then be wound into a roll and transported to another assembler or manufacturer.

One drawback of punched tapes is that the portion of the tape containing the punched hole is weaker than the adjacent areas of tape. Thus, the holes or pockets are the preferred points of flexure for the tape. This creates a problem. When the punched carrier tape is wound into a roll, the tape is most likely to flex or bend in the area of a pocket, which can cause damage to the component contained in the pocket since the component is forced to "bend" with the roll.

Another drawback of punched carrier tapes is that the process of punching holes into the strip of material often creates residual particulates in the pockets or on the face of the carrier tape. These particulates can contaminate components that are placed in the pockets, may obstruct the small vacuum orifices of some robotic placement equipment, or may otherwise interfere with the ability of the robotic placement equipment to recognize and grasp components.

Punched carrier tapes are typically only useful for components that are thinner than the paper tape being punched. Parts that are thicker than the carrier tape would be exposed above the carrier tape and susceptible to damage. Therefore, punched carrier tapes are only useful for very thin components or for components that are thicker than the carrier tape but are not easily damaged by contact, such as contact with adjacent windings of tape when the tape is wound into a roll.

To protect components that are thicker than paper and susceptible to damage, another type of carrier tape known as an embossed carrier tape is often used. One example of such a carrier tape is illustrated in U.S. Pat. No. 4,736,841 (Kaneko et al.). In embossed carrier tapes, it is typical identical pockets to be formed at predetermined uniformly spaced intervals along the carrier tape length, where the pockets frequently are closely sized to receive a particular component. With most embossed carrier tapes, a cover strip is affixed over the pockets to keep the components from falling from the carrier tape. If the pockets are too large for the components placed therein, the components tend to shift and rotate in the pockets, which may make it difficult or impossible for the robotic placement equipment to remove those components from the carrier tape. In addition, component movement within the pockets may cause the components to collide with the pocket walls, thereby damaging the components. Finally, because the components are typically confined on all sides by pocket walls, there are limitations on the methods and equipment that can be used to remove the components from the pockets.

To address the component movement problem and to eliminate the need for a cover tape, embossed carrier tapes are also known to have adhesive placed in the bottom of each pocket. An example of this is illustrated in U.S. Pat. No. 5,089,314(Masujima et al.) where the adhesive is formed of a material that does not exhibit any adhesion until it is heated. Alternatively, individual pieces of double-sided adhesive tape may be placed in the bottom of each pocket for securing components within the pockets. With either type of adhesive, however, individual droplets or tape pieces must be accurately placed within each pocket by some type of adhesive placement equipment. This equipment must be sufficiently sophisticated to properly index the carrier tape and accurately place adhesive within each pocket. This process tends to be more time consuming and complex than if a single strip of adhesive could be applied along the entire length of the carrier tape.

In view of the disadvantages of conventional carrier tapes, it is therefore desirable to provide a carrier tape that allows flexibility in positioning components along its length while providing a structure that protects the components from physical damage.

SUMMARY OF THE INVENTION

In one embodiment, the invention relates to a flexible carrier tape used for protecting components while they are being transported. The carrier tape comprises a strip portion having a component-receiving surface and first and second longitudinal edge surfaces. A plurality of walls extend from the component-receiving surface between the first and second longitudinal edge surfaces, and the walls extend longitudinally along the carrier tape. The carrier tape further comprises an adhesive on at least a portion of the component-receiving surface between at least one of the plurality of walls and one of the first and second longitudinal edge surfaces. The plurality of walls are preferably arranged as pairs of walls along the length of the carrier tape, where a first wall of each pair of walls is transversely opposite at least a portion of the second wall of each pair of walls. In this configuration, a component storage area is defined between the first and second wall of each pair of walls in the transverse direction of the tape. The strip portion may include a hole positioned in each component storage area and may also include a means for advancing the carrier tape by an advancement mechanism.

The carrier tape may include at least one reinforcing rib extending from the surface of the carrier tape opposite the component-receiving surface. It is preferable that any reinforcing ribs are generally perpendicular to at least one of the first and second longitudinal edge surfaces.

The carrier tape of the present invention is particularly advantageous for protecting components during transportation and delivery thereof to robotic placement equipment. The components may placed on the adhesive, preferably in the component storage areas, and the loaded carrier tape may be wound about the core of a reel. In this way, the carrier tapes may be used to protect the components stored on the carrier tape wound about the core. The walls in one winding engage the rear surface of the strip portion in an adjacent winding to protect the stored components from contacting the rear surface of the strip portion of the adjacent winding.

BRIEF DESCRIPTION OF THE DRAWINGS

The invention will be more fully appreciated with reference to the following drawings in which similar reference numerals designate like or analogous components throughout and in which.

DETAILED DESCRIPTION OF THE PREFERRED EMBODIMENTS

Figure 1:
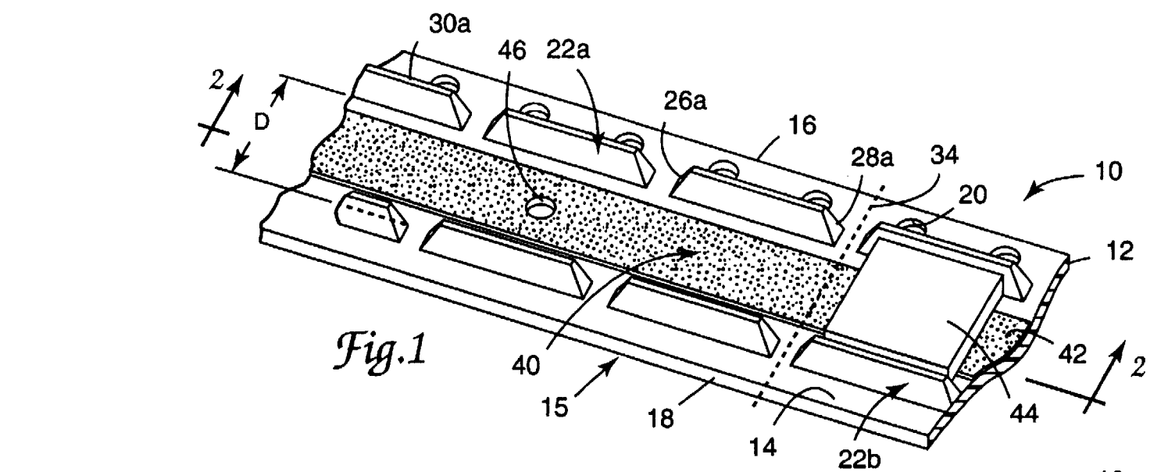
FIG. 1 is a fragmentary perspective view of one embodiment of a carrier tape according to the invention.
Figures 2, 3:
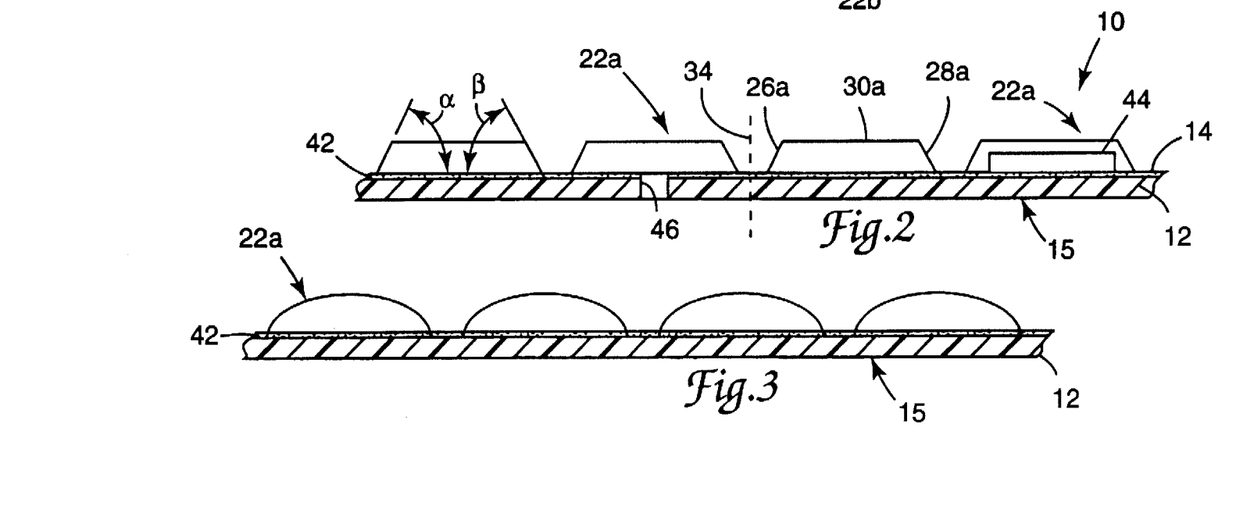
FIG. 2 is a sectional view taken along lines 2—2 of FIG. 1.
FIG. 3 is a sectional view similar to that of FIG. 2, illustrating an alternative wall configuration of the carrier tape according to the invention.

Referring now to the drawings, and initially to FIGS. 1 and 2, a first embodiment of a carrier tape 10 according to the present invention is shown. Carrier tape 10 may be used to transport components (e.g., electronic components, such as surface mount components, including resistors, memory chips, integrated circuits, and capacitors) from a component manufacturer to a different manufacturer that removes the components from the carrier tape and assembles the components into new products. Carrier tapes are commonly used in conjunction with automated assembly equipment, where an advancement mechanism automatically advances the carrier tape so that robotic placement equipment can sequentially remove components from the carrier tape and place the components in another location, such as a specific position and orientation on a circuit board.

Although carrier tape 10 is particularly suitable for use in automated processes, the carrier tape may be used in a semi-automated process where the loaded carrier tape is advanced by automated equipment. An operator, rather than a robot, then removes components from the carrier tape. It is also contemplated that the carrier tape be used in a completely manual system, where the loaded carrier tape is not used in conjunction with any type of automated equipment. Rather, the operator manually removes a component from the carrier tape then manually advances the carrier tape so that the next component may be removed.

According to a preferred embodiment, carrier tape 10 is preferably an elongated flexible tape having a strip portion 12 defining a face, or componentreceiving, surface 14 and an opposed rear surface 15. Component-receiving surface 14 is the surface of carrier tape 10 on which components may be loaded and stored. Strip portion 12 includes longitudinal edge surfaces 16 and 18 on opposite transverse sides of strip portion 12, which are preferably parallel to each other. Strip portion 12 also includes at least one row of aligned advancement holes 20 formed in strip portion 12 and extending in a row spaced inwardly from one of the longitudinal edge surfaces 16 and 18. An optional second row of advancement holes 20 may be spaced inwardly from the other of the longitudinal edge surfaces 16 and 18. Advancement holes 20 are typically sized and spaced to engage with a specific advancement mechanism (not shown). The advancement mechanism may comprise, for example, one sprocket for each row of advancement holes 20, where the teeth of each sprocket engage advancement holes 20 to advance carrier tape 10 toward a predetermined location so that the robotic placement equipment may either place components on the carrier tape or remove components from the carrier tape.

A first series of walls 22a extends from component-receiving surface 14 of strip portion 12 and are spaced inwardly from longitudinal edge surface 16. Preferably each wall is spaced an equal distance from longitudinal edge surface 16; however, equal spacing is not required and walls 22a may be staggered. Walls 22a are substantially parallel to longitudinal edge surface 16 (i.e., between 0° and 10°) but may be oriented at a larger angle with respect thereto (i.e., greater than 10°). It is also preferred that each wall 22a be longitudinally spaced an equal distance from each longitudinally adjacent wall. Also extending from component-receiving surface 14 is a second series of walls 22b which are preferably substantially identical to walls 22a. Walls 22b are spaced inwardly from longitudinal edge surface 18, are generally parallel thereto (i.e., between 0° and 10°), and are preferably longitudinally spaced an equal distance from each longitudinally adjacent wall 22b. As with walls 22a, however, staggered spacing from longitudinal edge surface 18 and orientation at a larger angle thereto (i.e., greater than 10°) are possible for walls 22b.

Many wall configurations are contemplated by the present invention. For example, walls 22a can have various shapes when viewed in the transverse direction of the carrier tape, such as squares, rectangles, triangles, half circles, and the like. However, the preferred shape of walls 22a is a truncated pyramid, as illustrated in FIG. 2. In this embodiment, each wall 22a includes first and second side surfaces 26a and 28a that extend upwardly from strip portion 12, and a top surface 30a that connects the side surfaces 26a and 28a at their furthest points from the face surface 14 of carrier tape 10.

Each side surface 26a preferably extends from the strip portion 12 at an angle α, where angle αa is preferably less than or equal to 90 degrees, but angle α may be greater than 90 degrees. Similarly, each side surface 28a preferably extends from the strip portion 12 at an angle β, where angle β is preferably less than or equal to 90 degrees, but angle β may also be greater than 90 degrees. In the preferred embodiment, angle α is equal to angle β; however, angles α and β may differ from each other.

FIG. 3 illustrates an alternative embodiment of the walls 22aand 22b. As shown, the shape of the walls 22a when viewed in the transverse direction is generally a half-circle, but could be any suitable elliptical shape. Differing manufacturing constraints and design considerations (e.g., size and shape of the components to be loaded onto the carrier tape) typically dictate the most appropriate wall shape for a particular carrier tape. It is preferred that the walls 22a and 22b are generally the same size and shape; however, it is understood that the walls 22a and 22b may differ from each other in size and shape within a single carrier tape 10.

Each wall 22a is preferably adjacent to other walls 22a and each wall 22b is preferably adjacent to other walls 22b in the longitudinal direction of carrier tape 10. Each wall 22a is also preferably positioned so that at least some portion of wall 22a is transversely opposite at least some portion of wall 22b, and more preferably positioned so that at least 95% of wall 22a is transversely opposite at least 95% of wall 22b. Pairs of walls 22a, 22b are defined as one wall 22a and one wall 22b that are transversely opposite at least some portion of each other. The areas or spaces between adjacent pairs of walls 22a, 22b have a lower bending moment than the areas where walls 22a, 22b extend from strip portion 12, which are therefore the preferred areas of flexure for carrier tape 10. A flexure line 34 is thus defined as the preferred line between adjacent pairs of walls 22a, 22b about which carrier tape 10 will flex when it is wound into a hub or reel. Flexure of carrier tape 10 may be further enhanced by providing notches (not shown) in the strip portion 12 in the area of flexure lines 34.

Figure 4:
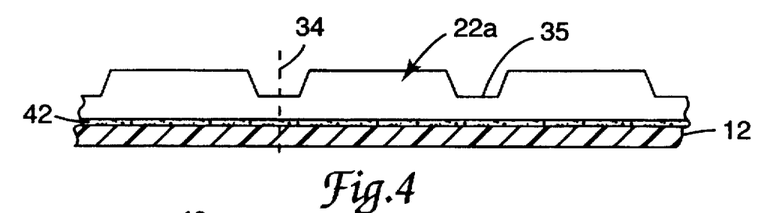
FIG. 4 is a sectional view similar to FIG. 2 but showing walls formed by embossing a single wall section.

Flexure lines 34 can be any weakened area between adjacent pairs of walls 22a and 22b, which may either be a definite space between adjacent pairs of walls 22a or 22b or may be a single wall length that is weakened in some way such as slitting or embossing the single wall to define multiple adjacent walls. FIG. 4 illustrates a carrier tape 10 where walls 22a are formed by embossing a single wall section to define weakened areas 35 between separate walls along the length of the carrier tape. These weakened areas generally coincide with the area of flexure lines 34.

Each wall 22a in a pair of walls 22a and 22b is spaced from a wall 22b in that pair of walls by a distance D in the transverse direction of carrier tape IO. The distance D is typically determined by the width of components that are to be transported on that carrier tape 10.

Multiple component storage areas 40 are spaced along the length of the carrier tape 10, wherein each component storage area 40 is preferably defined between a wall 22a, a wall 22b, and adjacent flexure lines 34. By changing the position, orientation, spacing, and size of walls 22a and 22b, component storage areas 40 may be designed to conform to the size and shape of the components they are intended to receive; however, one of the advantages afforded by the present invention is that a single component storage area of generic design can accommodate components of widely varying sizes and shapes. In any case, it is preferred that the height of walls 22a and 22b is greater than the height of the components to provide maximum protection to the components stored in the component storage areas 40.

The carrier tape 10 also includes an adhesive or adhesive portion 42 positioned within each component storage area 40 for securing components to the carrier tape 10. While FIG. 1 shows the adhesive 42 as a single adhesive strip applied along the length of the carrier tape between the series of walls 22a and the series of walls 22b, other configurations of adhesive 42 are contemplated. If double-sided tape is used, for example, it may be as wide as the distance D between walls 22a and 22b or may cover only a portion of the distance D between walls 22a and 22b. Alternatively, adhesive 42 may comprise multiple strips of double-sided tape spaced from one another, or may comprise discrete segments of tape applied within each component storage area 40. Adhesive 42 may also comprise a ring or bead of adhesive, or a series of spaced dots of adhesive in a circular, triangular, or other shaped distribution. Alternatively, adhesive 42 may be a continuous or noncontinuous strip of adhesive screen printed on strip portion 12.

The amount, type, and configuration of adhesive 42 applied to a carrier tape may vary over a wide range, depending on the size and shape of the component to be secured within a component storage area 40. In general, neither the shape nor the placement of adhesive 42 is crucial, as long as the adhesive has sufficient adhesion to secure components within the component storage areas 40, but still can release the components as desired. Because adhesive 42 provides the principle means for retaining components in component storage areas 40, a single component storage area 40 having a generic design may be used to accommodate various shapes and sizes of components. In other words, component storage areas 40 need not be closely shaped or sized to receive particular components as long as adhesive 42 has sufficient adhesion to adhere the components to the carrier tape 10. The amount of adhesive 42 used on carrier tape 10 may vary over a wide range and may be influenced by the size and weight of the component to be adhered in the component storage areas 40 (i.e., larger, heavier components will require more adhesive than smaller, lighter components). However, it is preferred that the amount of adhesive used is sufficient to secure the component in the component storage area in the orientation in which the robot can most easily grasp the component, but not such a large amount that the component is raised too high in the component storage area for the robot to easily remove the component.

Adhesive 42 is preferably selected to be of the type that allows clean removal of the component from the adhesive 42, such that no adhesive residue remains on the component after it is removed from carrier tape 10. It is also preferred that the adhesive be both non-contaminating and non-corrosive to the components. Preferred adhesive compositions for use in the present invention are pressure sensitive adhesive (PSA) materials of the type that display sufficiently aggressive tackiness to a wide variety of substrates after applying only light pressure. An accepted quantitative description of a pressure sensitive adhesive is given by the Dahlquist criterion line, which indicates that materials having a storage modulus (G) of less than about $3 \times 10^5$ Pascals (measured at 10 radians/second at a room temperature of about 20° to 22° C.) have pressure sensitive adhesive properties. More specifically, the types of pressure sensitive adhesive that are appropriate for use in the present invention include acrylic adhesives (e.g., isooctyl acrylates), rubber-based adhesives (e.g., isoprene-based adhesives), and tackified block copolymers (e.g., tackified styrene-butadiene adhesives).

Also useful in the invention are certain non-pressure sensitive adhesive (nonPSA) materials. Useful adhesives of this type comprise a thermoplastic elastomer block copolymer and preferably have a storage modulus greater than $1 \times 10^6$ Pascals at room temperature. The thermoplastic elastomer block copolymer may comprise segments of styrene and segments of a rubbery elastomer. Specific examples of thermoplastic elastomer block copolymers useful in the invention include styreneethylene/propylene-styrene block copolymer, styrene-ethelene/propylene-styreneethylene/propylene block copolymer, styrene-ethylene/butylene-styrene block copolymer, and blends thereof FIGS. 1 and 2 illustrate a component 44 positioned within a component storage area 40 on adhesive 42, as would be typical for use of carrier tape 10 of the present invention. It is preferable that one component 44 be located in each component storage area 40; however, multiple components 44 may be stored in a single component storage area 40 or some component storage areas 40 may not contain a component 44. It is also preferable that each component 44 is centrally located within a component storage area 40, although a component 44 may be offset from the center of the component storage area 40 in which it is positioned.

The carrier tape 10 may also have an aperture or through-hole 46 positioned within each component storage area 40 that can accommodate a mechanical device, such as a stylus or pin, that can be pushed through the hole 46 to facilitate removal of a component 44. The aperture 46 may also be used for other purposes, such as by an optical scanner to detect the presence or absence of a component within a component storage area.

One particular embodiment of carrier tape 10 for a component that is 8 mm×7 mm×0.5 mm is specifically described with reference to FIGS. 1 and 2. For components of this size, strip portion 12 is preferably 12 mm±0.3 mm in width, to conform to standards established by the International Electrotechnical Commission (IEC), the Electronic Industries Association (EIA), the Japanese Industrial Standards (JIS), and other similar industrial standardization bodies. Other standard strip widths include 8 mm, 16 mm, 24 mm, 32 mm, 44 mm, and 56 mm. Walls 22a and 22b are preferably truncated pyramids in shape, where the wall height is preferably less than or equal to 6.5 mm, the wall thickness where the wall and strip portion meet is preferably equal to or greater than the thickness of strip portion 12, the wall length is preferably 8 mm or less, and the angles α and β are each approximately 84 degrees. Each wall 22a, 22b is preferably spaced from each adjacent wall 22a, 22b, respectively, by a distance that is preferably equal to or greater than the thickness of strip portion 12, and each wall 22a is preferably spaced by a distance D of 9 mm or less from each wall 22b.

Figure 5:
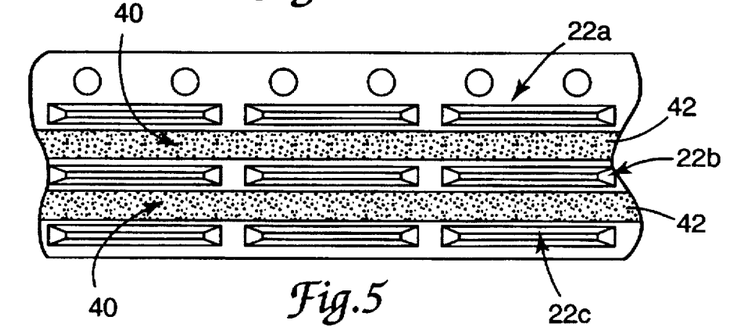
FIG. 5 is a plan view of a carrier tape according to the invention showing two columns of component storage areas.

Two or more columns of component storage areas can also be formed along the length of carrier tape 10 to facilitate the transportation of more than one row of components, as shown in FIG. 5. This can be accomplished by providing an additional series of walls 22c spaced in the transverse direction from either the first series of walls 22a and/or the first series of walls 22b. As shown, walls 22c are spaced from walls 22b. In this embodiment, more than one component storage area is defined between pairs of walls in the transverse direction of the carrier tape. Specifically, one component storage area is defined between each pair of walls 22a and 22b and another component storage area is defined between each pair of walls 22b and 22c. When two or more columns of component storage areas are provided on a single carrier tape, the multiple columns are preferably arranged parallel to each other with the series of walls in one column being parallel to and transversely opposite the series of walls in another column. The columns of adjacent component storage areas can share a common series of walls, such as walls 22b in FIG. 5, where a first column of component storage areas is located in the transverse direction between a first series of walls 22a and a second series of walls 22b, and a second column of component storage areas is located in the transverse direction between that same second series of walls 22b and a third series of walls 22c. In this way, three series of walls can make up two columns of component storage areas. Alternatively, the columns of adjacent component storage areas can each have their own pairs of walls (not shown), such that four series of walls are required to make up 2 columns of component storage areas.

Figure 6:
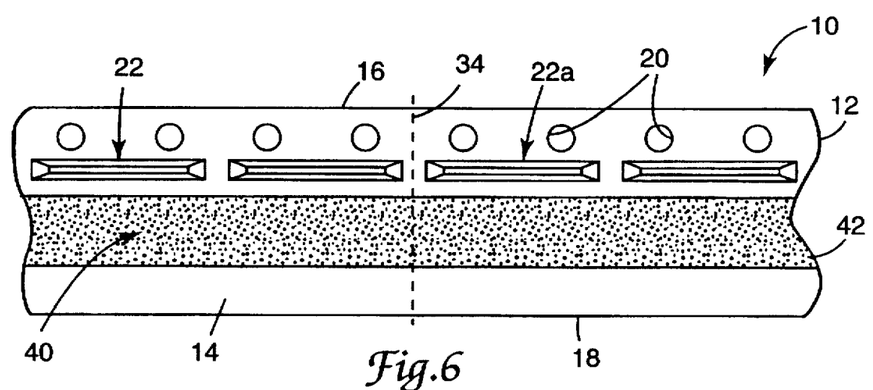
FIG. 6 is a plan view similar to FIG. 5 but showing a single row of walls defining component storage areas.

FIG. 6 illustrates another alternative embodiment of carrier tape 10, comprising only a single series of walls 22a spaced inwardly from longitudinal edge surface 16. Walls 22a comprise similar characteristics to walls 22a described above with respect to FIGS. 1 and 2. In this embodiment, there are no walls transversely opposite walls 22a. Rather, adjacent flexure lines 34 on either side of walls 22a define component storage areas 40 in the longitudinal direction, while walls 22a and the area transversely opposite walls 22a define component storage areas 40 in the transverse direction. In this embodiment, components are placed on adhesive 42 between adjacent flexure lines 34 so that walls 22a can provide at least partial protection for the components when carrier tape 10 is wound about a hub.

Figure 7:
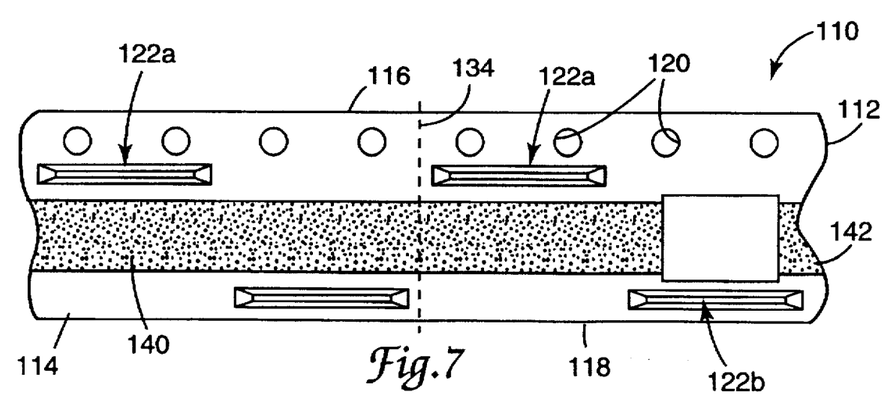
FIG. 7 is a plan view showing another embodiment of a carrier tape according to the invention.

FIG. 7 illustrates another embodiment of the carrier tape 110 of the present invention, comprising a first series of walls 122a and a second series of walls 122b, wherein each wall 122a and 122b of the series of walls comprises similar component parts and characteristics as the walls 22a and 22b described above. However, the series of walls 122a and 122b are arranged so that no wall 122a is directly opposite a wall 122b. Rather, each wall 122a is spaced in the longitudinal direction by approximately one wall length from the next adjacent wall 122a, where a flexure line 134 is located between one side of a wall 122a and one side of a wall 122b. Although not specifically illustrated, other configurations of walls and spaces between walls in both the longitudinal and transverse directions are contemplated by the present invention.

Figure 8:
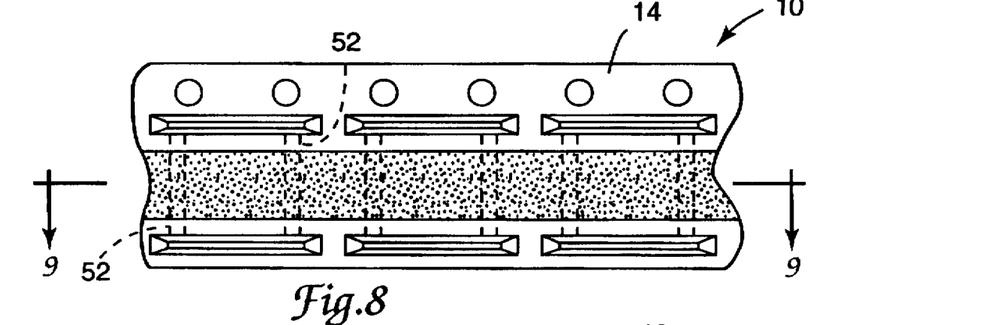
FIG. 8 illustrates another embodiment of a carrier tape according to the invention similar to the carrier tape of FIG. 1, with the additional feature of reinforcing ribs.
Figure 9:
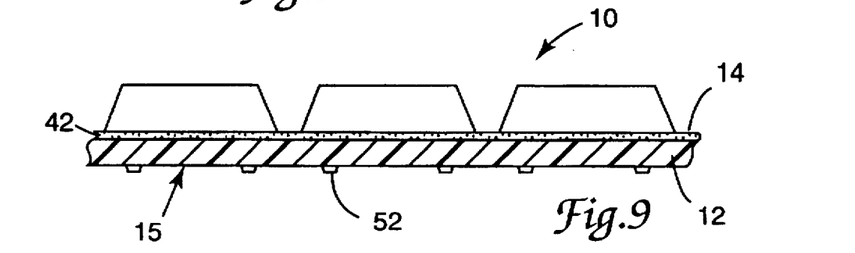
FIG. 9 is a sectional view taken along lines 9—9 of FIG. 8.

FIGS. 8 and 9 illustrate a carrier tape 10 according to the invention and further including at least one reinforcing rib 52 extending from rear surface 15 of strip portion 12 so as to increase the strength of the carrier tape in the transverse direction, a feature that is particularly useful where the distance D between two opposed walls 22a and 22b is large. It is also contemplated that the reinforcing ribs extend from face surface 14 in the transverse direction of strip portion 12. The reinforcing ribs may be formed from the strip pattern 12, such as by a thermoforming process, or may be separately formed and attached to the face surface 14 or the rear surface 15 of strip portion 12. Preferably, the reinforcing ribs are oriented so as to be substantially perpendicular (i.e., 90°±5°) to longitudinal edge surfaces 16 and 18, although they may be oriented at some other angle, or formed so as to have an X or V shape. Reinforcing ribs 52 may extend across the entire width of the carrier tape or only a portion thereof, depending on the amount of reinforcement that is needed. Preferably, the reinforcing ribs are positioned beneath a component storage area 40; providing the reinforcing ribs in the area of flexure line 34 could inhibit the ability of the carrier tape to bend when, for example, it is wound about the hub of a storage reel. While FIGS. 8 and 9 show two reinforcing ribs 52 per component storage area 40, any number of reinforcing ribs 52 may be used depending on the amount of reinforcement that is required.

Figures 10, 11:
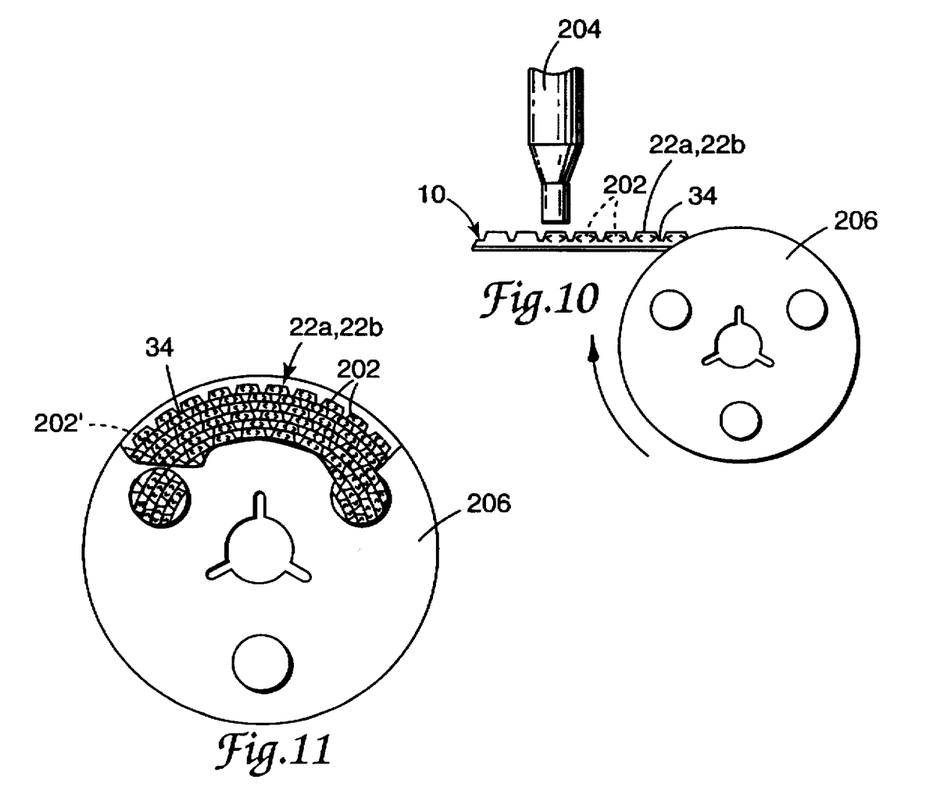
FIG. 10 is a schematic view illustrating one method of loading components onto a carrier tape according to the invention.
FIG. 11 is a fragmentary view of a carrier tape loaded with components and concentrically wound into a reel.

The strip portion 12 is preferably constructed from a variety of suitable thin polymeric materials including, but not limited to, polyester, polycarbonate, polypropylene, polystyrene, PVC (polyvinyl chloride), and ABS (acrylonitrilebutadiene-styrene). The polymeric material is typically selected so that the carrier tape 10 is sufficiently flexible to be wound about the hub of a reel 206, as shown in FIG. 10. However, the material is also preferably selected so that the carrier tape 10 is sufficiently strong or rigid so that the walls 22a and 22b do not collapse when the tape is wound onto a reel.

In the preferred embodiment, the polymeric material is electrically dissipative, and may include an electrically conductive material, such as carbon black, which is either interspersed within the material, or is coated on the carrier tape either before or after the tape is formed. The electrically conductive material allows an electric charge to dissipate throughout the carrier tape and preferably to the ground. This feature may prevent damage to the components contained within the carrier tape due to an accumulated electric charge.

Carrier tape 10 is preferably unitary and may be made by thermoforming walls 22a and 22b. The particular process used for manufacturing or forming carrier tape 10 is also typically selected to best suit the material and thickness of the material chosen for carrier tape 10. More specifically, a polymeric sheet of the type described above may be supplied either in roll form, sheet form, by continuous injection molding, or by extrusion. The sheet is conveyed to a heater, where the sheet is heated to permit thermoforming of the sheet. The temperature to which the polymeric sheet is heated may vary widely depending on the gauge of the sheet and the type of material from which the sheet is made. The walls are then thermoformed by drawing the heated polymeric sheet with a die or dies to form walls to the desired size and shape. The thermoformed carrier tape is then typically cooled until the polymeric material is sufficiently solidified. The carrier tape may then be subjected to other processing steps, such as punching advancement holes along at least one of the edge surfaces of the tape, to meet particular functional requirements of the tape.

Alternatively, carrier tape 10 may be a tape comprised of separate wall structures attached to face surface 14 of the carrier tape. The walls may be attached to the carrier tape by any known attachment method, such as adhesively, or by ultrasonic bonding processes.

It is further understood that adhesive 42 may be applied to carrier tape 10 during the process of forming walls 22a and 22b, or may be applied in a later, separate process, as long as that process occurs before components are placed in the component storage areas 40.

FIG. 10 illustrates loading carrier tape 10 with components 202 by a loader 204 as the carrier tape 10 passes by the loader 204. As shown, components 202 are preferably placed on carrier tape 10 between walls 22a and 22b in the transverse direction and between adjacent flexure lines 34 in the longitudinal direction. The loaded carrier tape may then be helically wound about a reel 206 for storage and transporting. The formation and loading steps associated with carrier tapes are generally known in the art, and are therefore not described in further detail herein.

FIG. 11 shows a fragmentary view of the reel 206 with the front face of the reel 206 partially broken away to better show carrier tape 10 loaded with components 202 and helically wound. When components 202 are positioned between walls 22a and 22b in the transverse direction and between adjacent flexure lines 34 in the longitudinal direction, these components 202 are prevented from contacting adjacent windings of carrier tape 10 by the walls 22a and 22b. For example, one component 202' is shown as being positioned between one pair of walls 22a and 22b, where the walls 22a and 22b are higher than the height of component 202'. Because the lowest bending moment of carrier tape 10 is at flexure lines 34, carrier tape 10 typically flexes about these flexure lines 34 on either side of walls 22a and 22b, while the walls 22a and 22b maintain their original shape. Although walls 22a and 22b do not typically deform when carrier tape 10 is wound about a core, some deformation of walls 22a and 22b may occur when winding carrier tape 10. The top surface of walls 22a and 22b contact the surface of carrier tape 10 opposite the component-receiving surface when carrier tape 10 is helically wound, thereby preventing component 202' from contacting subsequent, adjacent windings of carrier tape 10.

Figure 12:
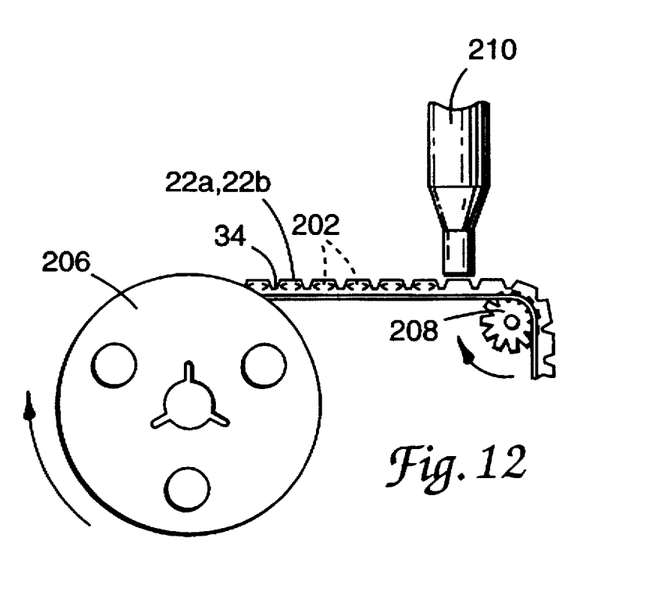
FIG. 12 is a schematic view illustrating one method of removing components from a carrier tape according to the invention.

The loaded carrier tape may be transported on the reel 206 to the location where the components 202 are to be removed, such as automated assembly equipment, where an advancement mechanism automatically advances the loaded carrier tape for removal manually or by robotic placement equipment. As illustrated in FIG. 12, carrier tape 10 is unwound from reel 206 by an advancement sprocket 208 to move the carrier tape 10 toward robotic placement equipment 210. The robotic placement equipment 210 removes each successive component 202 as it reaches the desired removal point by any known removal method, such as a vacuum pick-up device, and may then place the component 202 on a particular location on a circuit board or some other desired location. In most cases, it is preferable that adhesive 42 remains on carrier tape 10 upon removal of the components 202, rather than transferring onto the component, so that components 202 are not contaminated by adhesive residue.

The carrier tapes of the present invention are particularly useful in the electronics industry for transporting and delivering surface mount electronic components such as memory chips, integrated circuit chips, resistors, connectors, microprocessors, capacitors, gate arrays, and the like. However, the carrier tapes may be used to transport other components such as small springs, clips, and the like.

The present invention has now been described with reference to several embodiments thereof. It will be apparent to those skilled in the art that many changes can be made to the embodiments described without departing from the scope of the invention. Hence, the scope of the present invention shall not be limited by the structures described herein, but only be structures described by the language of the claims and the equivalents of those structures.

The embodiments for which an exclusive property or privilege is claimed are defined as follows:

1. An elongated flexible carrier tape for transporting a plurality of components, the carrier tape having a length and comprising:

a strip portion comprising a component-receiving surface and first and second longitudinal edge surfaces;

a plurality of walls extending from the component-receiving surface between the first and second longitudinal edge surfaces and extending longitudinally along the carrier tape, wherein each of the walls comprises a top surface spaced from the component-receiving surface, and wherein the top surface of each of the walls is spaced from the top surface of each adjacent wall in a longitudinal direction of the tape; and an adhesive on at least a portion of the component-receiving surface between at least one of the plurality of walls and one of the first and second longitudinal edge surfaces.

2. The carrier tape of claim 1, wherein each wall of the plurality of walls is adjacent to and aligned with another wall of the plurality of walls in the longitudinal direction of the tape.

3. The carrier tape of claim 1, wherein the plurality of walls comprises at least one pair of walls, wherein each pair of walls comprises a first wall adjacent to the first longitudinal edge surface and a second wall adjacent to the second longitudinal edge surface.

4. The carrier tape of claim 3, wherein a first pair of walls is adjacent to a second pair of walls along the length of the carrier tape.

5. The carrier tape of claim 3, wherein at least a portion of the first wall is transversely opposite at least a portion of the second wall, the carrier tape further comprising at least one component storage area defined between the first wall and the second wall of the at least one pair of walls in a transverse direction to the longitudinal edge surfaces.

6. The carrier tape of claim 5, further comprising a hole through the strip portion, wherein the hole is positioned within the at least one component storage area.

7. The carrier tape of claim 5, wherein the at least one component storage area contains a component.

8. The carrier tape of claim 3, wherein the first wall of each pair of walls is offset from the second wall of each pair of walls in a transverse direction to the longitudinal edge surfaces.

9. The carrier tape of claim 3, wherein the adhesive is between the first wall and the second wall of the at least one pair of walls.

10. The carrier tape of claim 3, wherein the first wall of the at least one pair of walls is generally parallel to the first longitudinal edge surface and the second wall of the at least one pair of walls is generally parallel to the second longitudinal edge surface.

11. The carrier tape of claim 1, wherein the strip portion further comprises a means for advancing the carrier tape by an advancement mechanism.

12. The carrier tape of claim 1, wherein the carrier tape is electrically dissipative.

13. The carrier tape of claim 1, further comprising at least one reinforcing rib, wherein each rib extends in a transverse direction of the carrier tape.

14. The carrier tape of claim 13, wherein each rib is generally perpendicular to at least one of the first and second longitudinal edge surfaces.

15. The carrier tape of claim 1, wherein the adhesive is a continuous adhesive strip.

16. The carrier tape of claim 1, wherein the flexible carrier tape is a unitary tape.

17. The carrier tape of claim 1, wherein the carrier tape is wound about the core of a reel.

18. An elongated flexible carrier tape for advancement by an advancement mechanism and for transporting a plurality of components, the carrier tape having a length and comprising:

a strip portion comprising a component-receiving surface, first and second longitudinal edge surfaces, and a means for advancing the carrier tape by an advancement mechanism;

a plurality of wall pairs extending from the component-receiving surface between the first and second edge surfaces, wherein at least one of the plurality of wall pairs comprises a first wall and a second wall, at least a portion of the first wall being transversely opposite at least a portion of the second wall, wherein the first and second walls of at least one of the plurality of wall pairs are adjacent to the first and second longitudinal edge surfaces, respectively, wherein each of the walls comprises a top surface spaced from the component-receiving surface, wherein the top surface of each of the walls is spaced from the top surface of each adjacent wall in a longitudinal direction of the carrier tape;

a plurality of component storage areas provided on the component-receiving surface wherein at least one of the component storage areas is defined as the area between the first wall and the second wall of at least one of the plurality of wall pairs; and an adhesive in at least one of the plurality of component storage areas for releasably attaching a component to the component-receiving surface.

19. The carrier tape of claim 18, wherein the carrier tape flexes transversely between the first component storage area and an adjacent second component storage area.

20. The carrier tape of claim 18, wherein the carrier tape is wound about the core of a reel.

21. A method of loading components into a carrier tape for seriatim delivery by an advancement mechanism, comprising the steps of:

(a) providing an elongated flexible carrier tape, the carrier tape comprising:
a strip portion comprising a component-receiving surface and first and second longitudinal edge surfaces;
a plurality of walls extending from the component-receiving surface between the first and second edge surfaces and extending longitudinally along the carrier tape, wherein each of the walls compromises a top surface spaced from the component-receiveng surface, and wherein the top surface of each of the walls is spaced from the top surface of each adjacent wall in longitudinal direction of the tape; and
an adhesive on at least a portion of the component-receiving surface between at least one of the plurality of walls and one of the first and second longitudinal edge surfaces; and (b) placing at least one component on the adhesive.

22. The method of claim 21, further including the step of winding the carrier tape around a core for storage and transporting thereof.

23. A method of protecting components on a carrier tape wound about the hub of a reel, the method comprising the steps of:

providing a carrier tape comprising a strip portion having a component-receiving surface, a rear surface, and first and second longitudinal edge surfaces, a plurality of walls extending from the component-receiving surface between the first and second longitudinal edge surfaces and extending longitudinally along the carrier tape, wherein each of the walls comprises a top surface spaced from the component-receiving surface, and wherein the top surface of each of the walls is spaced from the top surface of each adjacent wall in a longitudinal direction of the tape, and an adhesive on at least a portion of the component-receiving surface between at least one of the plurality of walls and one of the first and second longitudinal edge surfaces;

placing at least one component on the adhesive; and winding the carrier tape about the hub of a reel so as to provide a plurality of carrier tape windings, wherein the plurality of walls in one winding engage the rear surface of the strip portion in an adjacent winding to protect the at least one component from contacting the rear surface of the strip portion of the adjacent winding.

24. An elongated flexible carrier tape for transporting a plurality of components, the carrier tape having a length and comprising:

a strip portion comprising a component-receiving surface and first and second longitudinal edge surfaces;

a plurality of walls extending from the component-receiving surface between the first and second longitudinal edge surfaces and extending longitudinally along the carrier tape;

an adhesive on at least a portion of the component-receiving surface between at least one of the plurality of walls and one of the first and second longitudinal edge surfaces; and at least one reinforcing rib extending from a surface of the carrier tape opposite the component-receiving surface in a direction transverse to the longitudinal edge surfaces of the carrier tape.

* * * * *